(12) United States Patent
Brown et al.

(10) Patent No.: US 7,787,325 B2
(45) Date of Patent: Aug. 31, 2010

(54) ROW DECODE DRIVER GRADIENT DESIGN IN A MEMORY DEVICE

(75) Inventors: Jeffrey S. Brown, Fort Collins, CO (US); Jonathan W. Byrn, Fort Collins, CO (US); Mark F. Turner, Longmont, CO (US)

(73) Assignee: LSI Corporation, Milpitas, CA (US)

( * ) Notice: Subject to any disclaimer, the term of this patent is extended or adjusted under 35 U.S.C. 154(b) by 296 days.

(21) Appl. No.: 12/120,611

(22) Filed: May 14, 2008

(65) Prior Publication Data

US 2009/0285047 A1    Nov. 19, 2009

(51) Int. Cl.
  *G11C 8/00*    (2006.01)
(52) U.S. Cl. .................................. 365/230.06; 365/226
(58) Field of Classification Search ............ 365/230.06, 365/226, 230.08
  See application file for complete search history.

(56) References Cited

U.S. PATENT DOCUMENTS

| 5,901,096 | A  | * | 5/1999 | Inokuchi et al. ............. 365/201 |
| 6,118,728 | A  | * | 9/2000 | Casper et al. .......... 365/230.06 |
| 6,909,660 | B2 | * | 6/2005 | Oh ............................. 365/229 |
| 7,561,488 | B2 | * | 7/2009 | Lee et al. ............... 365/230.06 |

* cited by examiner

*Primary Examiner*—Anh Phung
(74) *Attorney, Agent, or Firm*—Duft Bornsen & Fishman LLP

(57) ABSTRACT

A memory device using a plurality of enhanced row decode drivers for activating wordlines in a memory array is disclosed. Circuit design attributes of the enhanced row decode drivers are varied as a function of proximity to a source of a row address signal applied to each decode driver. The circuit variations are operable to reduce the leakage power of the driver by degrading performance thereof while maintaining required worst case timing. The worst case timing being defined by the timing and performance requirements for the most distant of the row decode driver circuits relative to the source of the applied row address signals.

18 Claims, 5 Drawing Sheets

ROW DECODE DRIVER GRADIENT DESIGN IN A MEMORY DEVICE

BACKGROUND OF THE INVENTION

1. Field of the Invention

The invention is related to the field of electronic memory devices, and in particular, relates to a memory circuit design for reducing leakage power while maintaining timing performance.

2. Discussion of Related Art

In electronic memory devices, memory cells used for storing information are generally organized as a matrix of cells in column and row format. Memory cells which are organized in a specific row are coupled to a wordline signal path unique to the row. Memory cells which are organized along a specific column are coupled to a bitline signal path unique to the column. When the wordline on a row is activated, the memory cells arranged in the row become activated and allow information to be read from or written to the memory cells of that row along the bitlines in the columns.

In order to access information in the memory cells, memory devices typically use a row address to indicate which row of memory cells the information resides in. The row address is transmitted by control logic along a row address signal path to a plurality of identical row decode drivers, each of which is coupled to the row address signal path and to a corresponding wordline signal path coupled to a corresponding row. After receiving a row address, each row decode driver will determine if the row address identifies the particular row and the wordline signal path that the row decode driver is coupled to. If so, that row decode driver applies a signal to its corresponding wordline signal path to activate the memory cells of that corresponding row. When the row decode driver activates the wordline, memory cells along the wordline are selected for reading information from, or writing information to, the memory cells using the bitlines corresponding to the columns.

A timing delay (e.g., propagation delay and logic related delays) exists between transmitting the row address by the control logic, receiving the row address at any specific row decode driver, decoding the row address, and driving the wordline associated with the address. The rows of memory cells and the corresponding row decode driver circuits are physically placed on the memory circuit generally linearly displaced from the control logic that applies the row address to the row decode driver circuits. Thus a first row and its corresponding row decode driver may be physically closer to the control logic than the last row and its row decode driver circuit. The physical proximity of the row decode driver from the control logic affects the timing of the generation of wordline signals because of propagation delay differences between the various rows based on their proximity to the common control logic. When designing and specifying the memory device for timing, the "worst" case timing delay from the control logic to a row decode driver is determined and used for accessing information in the memory device. Use of the worst case timing ensures that under all conditions of accessing information in the memory device, regardless of the row being accessed, that the information will be valid.

Integrated circuit design always entails a tradeoff between speed of the circuit and leakage power. In general a circuit designed for higher speed operation will waste more power (e.g., leakage power) than will a similar circuit performing the same logic function at a slower clock speed. Thus it is an ongoing challenge in the design of memory devices to design for the required timing constraints (e.g., the worst case timing requirements of the row decode drivers coupled to the control logic) while reducing wasted leakage power.

SUMMARY OF THE INVENTION

The present invention improves upon the present state of the art in memory circuit designs by applying different circuit design attributes to the structure and operation of enhanced row decode drivers based on proximity of the row decode driver to the control logic circuits that supply the row address information to be decoded. This variation in circuit design attributes reduces the leakage power of the enhanced row decode drivers while maintaining timing performance in the memory device based upon the worst case timing delay.

In one aspect hereof an enhanced memory device is provided. The memory device includes a plurality of memory cells arranged in a matrix of rows and columns. Each memory cell is adapted to store information and includes an input signal path for selecting the memory cell and an input/output signal path for reading information from, or writing information to, the memory cell when selected. The memory device also includes a plurality of wordline signal paths each coupled to the input signal path of the memory cells in a corresponding row of the matrix. The memory device further includes a plurality of row decode drivers each associated with a corresponding row of the matrix. Each row decode driver includes an input coupled to a row address signal path and an output coupled to the wordline signal path which is, in turn, coupled to the corresponding row. Each row decode driver is adapted to activate its corresponding wordline signal path by applying a signal to its output in response to receipt of a row address applied to its input that identifies the corresponding row. The memory device also includes control logic adapted to apply a row address along the row address signal path to the plurality of row decode drivers to identify a row of the matrix to be selected by the wordline signal path activated by the row decode driver corresponding to the identified row. Each row decode driver includes a circuit design attribute that varies as a function of physical proximity of the row decode driver to the control logic. The variation of the circuit design attribute of a row decode driver is operable to reduce a leakage power of the row decode driver.

Another aspect hereof provides a method of operating such an enhanced memory device. The method includes generating a row address in a control logic circuit of the memory device and transmitting the row address along a row address signal path to a plurality of row decode drivers. The method includes receiving the row address in each row decode driver. Each row decode driver is coupled through a corresponding wordline signal path to a plurality of memory cells in a corresponding row and each row decode driver has a circuit design attribute that determines timing of its operation as a function of its physical proximity to the control logic. Variation of the circuit design attribute of a row decode driver is operable to reduce a leakage power of the row decode driver. The method also includes operating a row decode driver to select the memory cells in its corresponding row responsive to receipt of a row address identifying its corresponding row. The operation of the row decode driver generates a signal on its corresponding wordline signal path in accordance with the timing determined by its circuit design attribute. The method then includes reading data from, or writing data to, the selected memory cells.

The invention may include other exemplary embodiments described below.

BRIEF DESCRIPTION OF THE DRAWINGS

The same reference number represents the same element or same type of element on all drawings.

DETAILED DESCRIPTION OF THE DRAWINGS

FIGS. 1-6 and the following description depict specific exemplary embodiments of the invention to teach those skilled in the art how to make and use the invention. For the purpose of teaching inventive principles, some conventional aspects of the invention have been simplified or omitted. Those skilled in the art will appreciate variations from these embodiments that fall within the scope of the invention. Those skilled in the art will appreciate that the features described below can be combined in various ways to form multiple variations of the invention. As a result, the invention is not limited to the specific embodiments described below, but only by the claims and their equivalents.

Figure 1:
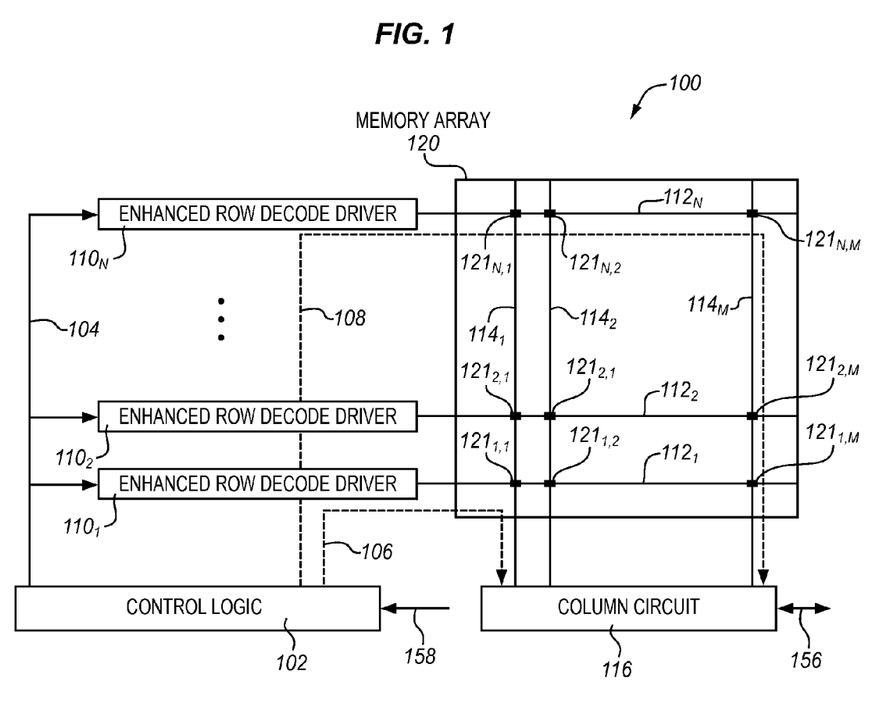
FIG. 1 is an illustration of a memory device in an exemplary embodiment of the invention.

FIG. 1 is an illustration of an enhanced memory device 100 in an exemplary embodiment of the invention. Enhanced memory device 100 includes enhanced row decode drivers $110_1 \ldots 110_N$ coupled to corresponding wordline signal paths $112_1 \ldots 112_N$, respectively. Enhanced row decode drivers $110_1 \ldots 110_N$ operate to receive a row address transmitted from control logic 102. The received row address indicates which one of the multiple wordline signal paths $112_1 \ldots 112_N$ to activate (i.e., the selected or addressed row). As discussed further herein below, the enhanced row decode drivers $110_1 \ldots 110_N$ are designed to reduce leakage power based on their relative proximity to control logic 102 while maintaining the requisite worst case timing to permit proper access to any row.

Enhanced memory device 100 also includes memory array 120. Memory array 120 includes a matrix of memory cells 121 arranged in row and column format. Each memory cell as shown in FIG. 1 is shown with a subscript designation indicating the row and column with which it is associated—e.g., $121_{R,C}$ stands for memory cell 121 associated with row "R" and with column "C". The exemplary memory array 120 of FIG. 1 shows a matrix of N rows (numbered 1 through N) and M columns (numbered 1 through M).

Every memory cell of array 120 has an input signal path coupled to a corresponding wordline signal path and has an input/output signal path coupled to a corresponding bitline signal path. For example, row 1 of array 120 comprises memory cells $121_{1,1}$ through $121_{1,M}$ all coupled to wordline $112_1$ and enhanced row decode driver $110_1$. Row 2 of array 120 comprises memory cells $121_{2,1}$ through $121_{2,M}$ all coupled to wordline $112_2$ and enhanced row decode driver $110_2$. In like manner, row N of array 120 comprises memory cells $121_{N,1}$ through $121_{N,M}$ all coupled to wordline $112_N$ and row decode driver $110_N$. Each memory cell of array 120 has an input/output signal path coupled to a corresponding bitline $114_1 \ldots 114_M$. Memory cells $121_{1,1} \ldots 121_{N,1}$ are all coupled to bitline $114_1$, cells $121_{1,2} \ldots 121_{N,2}$ are all coupled to bitline $114_2$, and so on through bitline $114_M$ corresponding to column M. Those of ordinary skill in the art will readily recognize that any number of cells may be disposed in a memory array arranged into any suitable number of rows and columns. Thus array 120 of FIG. 1 is intended merely as exemplary of one possible arrangement of a memory array useful in accordance with features and aspects hereof.

Figure 2:
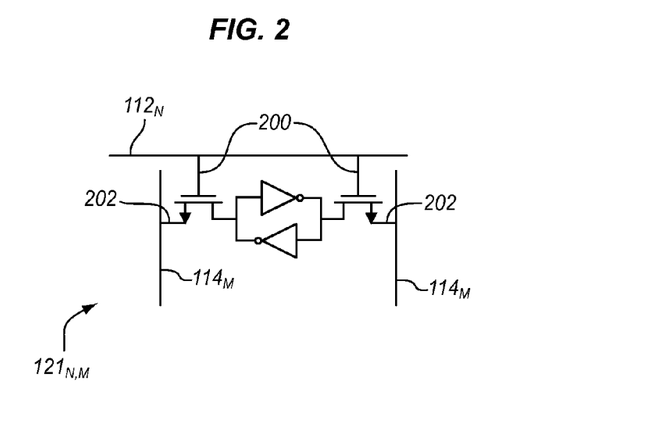
FIG. 2 illustrates an exemplary SRAM cell as coupled in an enhanced memory device as in FIG. 1.

One skilled in the art will recognize that memory cells 121 may comprise a variety of memory cell types as required for memory device 100, including SRAM (static random access memory) DRAM (dynamic random access memory) or other types of memory cells operable for storing information. FIG. 2 is a diagram showing details of a typical SRAM cell as may be used in memory array 120 of FIG. 1. In particular, FIG. 2 shows exemplary details of memory cell $121_{N,M}$ of FIG. 1 which couples input signal paths 200 to wordline $112_N$ (because it is coupled to row N) and couples input/output signal paths 202 to bitline $114_M$ (because it is coupled to column M). When the cell is selected by a signal applied to input path 200 (via wordline $112_N$), the current state of the cell is applied to input/output signal paths 202 (and then to bitline $114_M$ to be sensed by appropriate sensing logic). If, while selected, a signal is driven onto input/output signal paths 202 (via bitline $114_M$), the state of the stored value may be changed. Various other forms of memory cells and appropriate coupling of each to the corresponding wordline and bitline for its row and column will be readily apparent to those of ordinary skill in the art.

Referring again to FIG. 1, when any of wordlines $112_1 \ldots 112_N$ are activated along an individual row, all memory cells arranged in the corresponding row are selected for reading information from, or writing information to, memory cells in that corresponding row. For example, when wordline $112_N$ is activated, memory cells $121_{N,1} \ldots 121_{N,M}$ are selected which allows information to be read from or written to the selected memory cells via bitlines $114_1 \ldots 114_M$.

Enhanced memory device 100 further includes column circuit 116 coupled to bitlines $114_1 \ldots 114_M$. Column circuit 116 is operable to receive information read from memory cells or is operable to write information to memory cells in memory array 120. Read data is received from a selected row of cells on bitlines $114_1 \ldots 114_M$ and applied to external data path 156. Write data is received on external data path 156 and applied to a selected row of memory cells via bitlines $114_1 \ldots 114_M$.

Enhanced memory device 100 further includes control logic 102. Control logic 102 receives an address from external address bus 158 for memory cells to be accessed (i.e., a byte/word or other unit of access). Control logic 102 is operable to transmit a row address portion of the received address along row address signal path 104 to enhanced row decode drivers $110_1 \ldots 110_N$. The row address includes information that is received by each enhanced row decode driver $110_1 \ldots 110_N$ to activate its corresponding wordline $112_1 \ldots 112_N$.

Details of design and operation of column circuit 116 and control logic 102 and coordination therebetween to perform desired read and write operations is generally known to those of ordinary skill in the art and is omitted herein for simplicity and brevity of this discussion.

When control logic 102 transmits a row address along address signal path 104 to enhanced row decode drivers $110_1 \ldots 110_N$, a delay occurs before the row address is received, decoded, and a corresponding wordline $112_1 \ldots 112_N$ is activated. This delay is, in part, a function of the path length of row address signal path 104 between control logic 102 and enhanced row decode drivers $110_1 \ldots 110_N$. For example, the length of row address signal path 104 between control logic 102 and enhanced row decode driver $110_N$ indicated by dashed line 108 is relatively longer than row address signal path 104 length to enhanced row decode driver $110_1$ as indicated by dashed line 106. This difference in signal path length is due to the physical proximity of the row decode drivers 110 from the control logic 102. The differences in row address signal path 104 length translates into a difference in timing between activating wordline $112_N$ by driver $110_N$ compared to activating wordline $112_1$ by driver $110_1$. This difference in timing will result in a difference in reading information from, or writing information to, memory cells $121_{N,1} \ldots 121_{N,M}$, and $121_{1,1} \ldots 121_{1,M}$, respectively. In other words, reading information from, or writing information to, memory cells in row N ($121_{N,1} \ldots 121_{N,M}$) is the worst case timing delay as compared to, for example, memory cells in row 1 ($121_{1,1} \ldots 121_{1,M}$).

Where, as in the prior art, row decode drivers utilize identical circuit design attributes regardless of these differences in proximal positioning and resulting propagation delays, leakage power is generated for no benefit in the timing. In other words, where all row decode drivers are designed for the worst case timing of the longest row address signal path, those row decode drivers with the shorter row address signal path lengths are performing faster than is necessary to maintain required timing for the physically closer rows of memory cells.

By varying circuit design attributes of enhanced row decode drivers $110_1 \ldots 110_N$ as a function of row address signal path 104 length in accordance with features and aspects hereof, the total leakage power of enhanced memory device 100 can be reduced, while maintaining timing performance within the worst case timing delay. In other words, whereas the most distant row decode driver ($110_N$ relative to the control logic 102 in the circuit physical layout) requires strict adherence to design specification for the worst case timing, those row decoders ($110_1 \ldots 110_{N-1}$) that are physically closer to the control logic 102 may be less critically designed for that worst case timing requirement. These closer row decode drivers may be designed to reduce leakage power at the expense of lower performance while staying within the requirements of the worst case timing of row decoder $110_N$.

Figure 3:
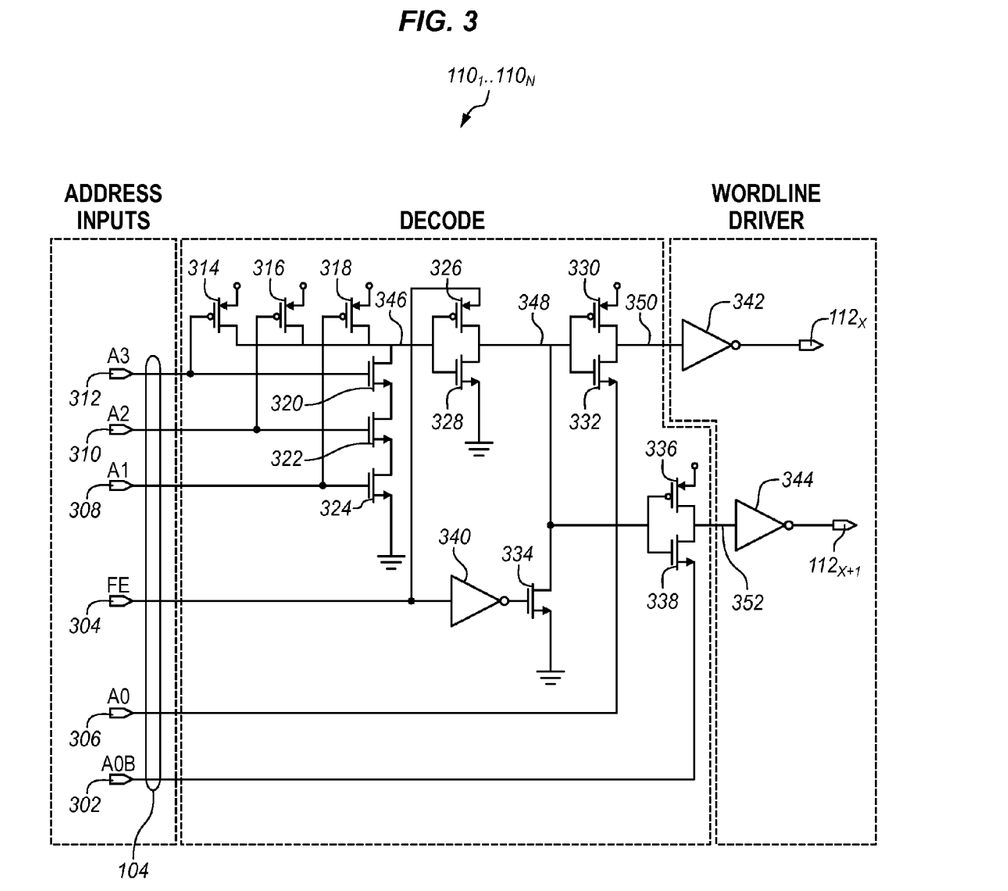
FIG. 3 is an exemplary enhanced row decode driver circuit of the memory device of FIG. 1 in an exemplary embodiment of the invention.

FIG. 3 is circuit diagram of any one of enhanced row decode drivers $110_1 \ldots 110_N$ of enhanced memory device 100 in an exemplary embodiment of the invention. Enhanced row decode driver of FIG. 3 is similar in structure to existing, well known row decode driver designs but is enhanced as discussed herein to alter circuit attributes based on Enhanced row decode driver 110 includes address inputs 302-312 to receive row addresses from control logic 102 (see FIG. 1). Enhanced row decode driver 110 also includes a decode section comprising transistors 314-338 and inverter 340 to generate logic signals based on address inputs 302-312. Enhanced row decode driver 110 also includes wordline drivers 342 and 344 for activating corresponding wordlines $112_X$ and $112_{X+1}$, respectively. Those of ordinary skill in the art will recognize that common design for a row decoder provides that the decoder generates signals for two rowlines based on a change in the lowest significant bit of the row address applied thereto. Thus, although the memory device of FIG. 1 suggests a row decode driver device that drives a single wordline signal, those of ordinary skill will readily recognize modifications to provide row decode driver circuits such as presented in FIG. 3 to drive two consecutive wordline signal paths.

Address inputs 306-312 correspond to address signals A0, A1, A2, and A3, which is representative of an exemplary 4 bit address for activating wordlines $112_X$ and $112_{X+1}$. Address input 302, which corresponds to signal A0B, is an inverted A0 signal. Address input 304, which corresponds to signal FE, is an enable signal. When address inputs 306-312 receive a row address of logic 1 with enable as a logic 1 (i.e., <A3-A0,FE> is <11111>), transistors 314-318 are 'off', and transistors 320-324 are 'on'. This operates to apply a logic 0 to signal 346. With address input 304 at a logic 1, inverter 340 applies a logic 0 to transistor 334, which turns this transistor off. With signal 304 a logic 1, and signal 346 a logic 0, transistors 326 and 328 operate to invert and apply a logic 1 to signal 348. With signal 348 at a logic 1, transistors 330 and 332 operate to invert this to a logic 0, which is applied to signal 350. With signal 350 a logic 0, driver 342 will invert this signal to a logic 1 and activate wordline $112_X$. As address input 306 is a logic 0, the inverse of this signal is applied to address input 302. This is operable to apply a logic 1 on signal 352, which un-selects wordline $112_{X+1}$ via driver 344. Thus, wordline $112_X$ is selected and wordline $112_{X+1}$ is un-selected. This is operable to activate memory cells coupled to wordline $112_X$ to allow information to be read therefrom, or written thereto. When address inputs 302-312 change, for example, when address inputs 306-312 are <1110>, wordline $112_X$ is now un-selected, and wordline $112_{X+1}$ is selected. With wordline $112_{X+1}$ selected, memory cells coupled to wordline $112_{X+1}$ are now active to allow information to be read therefrom, or written thereto.

Various design choices exist for varying the circuit design attributes of enhanced row decode drivers $110_1 \ldots 110_N$ to reduce the leakage power. One approach to varying circuit design attributes includes modifying the characteristics of the transistors that comprise the decode portion or the driver portion of enhanced row decode drivers $110_1 \ldots 110_N$ as a function of row address signal path 104 length. This can be accomplished by modifying the threshold voltage, a channel width, and/or a channel length of one or more transistors 314-338 to reduce the leakage power while maintaining the required timing performance. For example, modifying the circuit design attributes of transistors 336-338 to increase the delay of signal 352 would operate to reduce the performance (and hence leakage power) of the signal applied to wordline $112_{X+1}$ while maintaining the worst case timing delay requirement.

Modifying the circuit design attributes of the row decode driver may also include varying (e.g., reducing) the drive strength of the buffers 342 and 344 in the driver portion coupled to the wordlines $112_X$ and $112_{X+1}$, respectively. For example, modifying the circuit design attributes of driver 344 to reduce the sink/source current capability (i.e., drive current) would operate to reduce the speed of signals applied to wordline $112_{X+1}$ and hence the leakage power, by increasing the charge or discharge time of any capacitance present on wordline $112_{X+1}$ while maintaining the worst case timing delay requirement.

Modification of these, or other, characteristics/attributes of the decoder is operable to reduce leakage power while maintaining timing performance within the worst case timing delay. Since a row decode driver that is closer to the control logic (source of the address signals), it may operate slower but still be within the worst case timing requirements defined by the most distant row decode driver.

Figure 4:
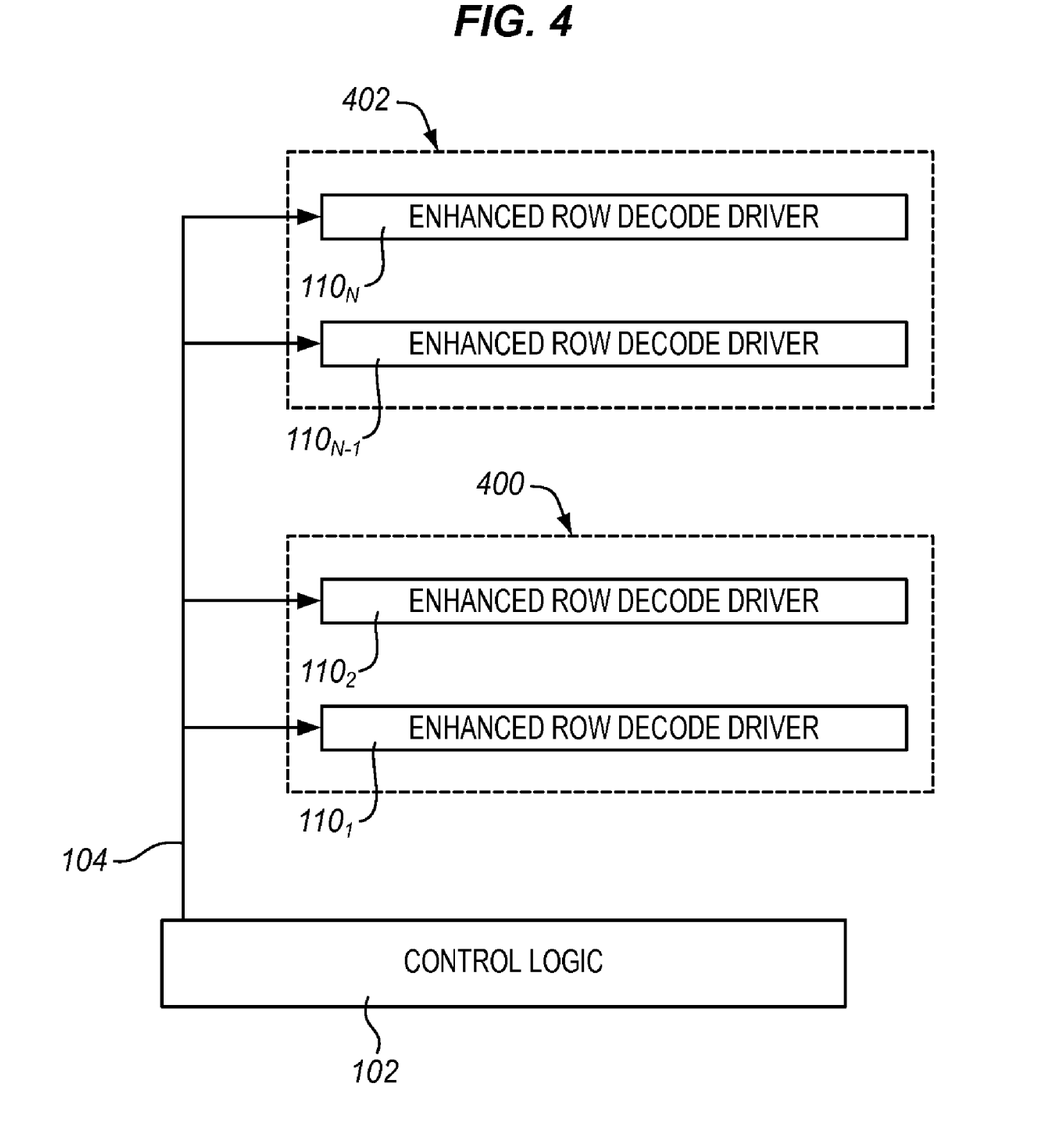
FIG. 4 illustrates exemplary groupings of row decode driver circuits that may use identical design attributes to reduce leakage power based on proximity as may be applied in FIG. 1

Each row decode driver $110_1 \ldots 110_N$ may be uniquely altered to reduce its leakage power by altering design attributes of the driver based on its unique proximity to the control logic that applies address signals thereto. In an alternative embodiment, enhanced row decode drivers $110_1 \ldots 110_N$ could also be logically associated in groups as indicated in FIG. 4. In this exemplary alternate embodiment, groups of enhanced row decode drivers have a similar level of reduced performance to reduce the leakage power while maintaining the worst case timing delay. Any such number of groupings may be provided as a matter of design choice. For example, groups may be defined as within a predefined percentile range of an allowed timing difference based on the group's proximity. Each group may comprise row decoders within a predefined percentile range faster than a worst case required timing for generating a signal on the wordline signal paths coupled to any of the plurality of row decode drivers. A first group 400 of row decode drivers $110_1$ and $110_2$ may be designed to the same timing requirements in that they are similarly situated as regards proximity to control logic 102 and thus within some defined percentile range of required timing performance. A second group 402 may be defined as drivers $110_{N-1}$ and $110_N$ as within a second percentile range of required performance. Each driver circuit within a group may thus be identically designed for the worst case timing requirements of that group of driver circuits.

Thus a gradient may be defined in the design attributes of the row decode drivers based on their respective proximity to the control logic that generates the applied address signals. Those of ordinary skill in the art will readily recognize a variety of groupings and gradient measures that may be applied to group the drivers that may use identical designs with respect to the design attributes that affect timing of the circuit and leakage power thereof.

Figure 5:
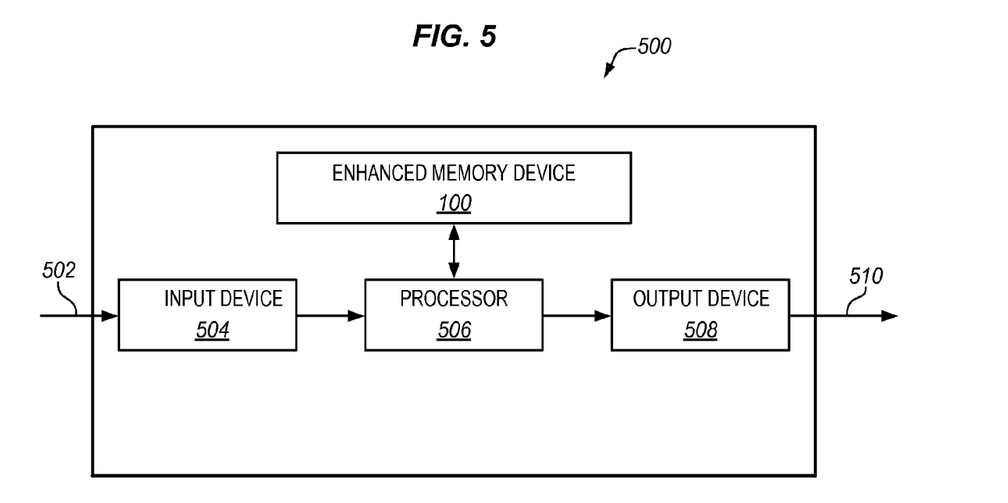
FIG. 5 is an illustration of a computer system utilizing the memory device of FIG. 1 in an exemplary embodiment of the invention.

FIG. 5 is an illustration of a computer system utilizing the enhanced memory device of FIG. 1 in an exemplary embodiment of the invention. Computer system 500 accepts input data 502 on input device 504 which is processed by processor 506. Processor 506 uses enhanced memory device 100 to store information and/or program instructions while processing input data 502. After processing input data 502, processor 506 transmits output data 510 through output device 508.

Figure 6:
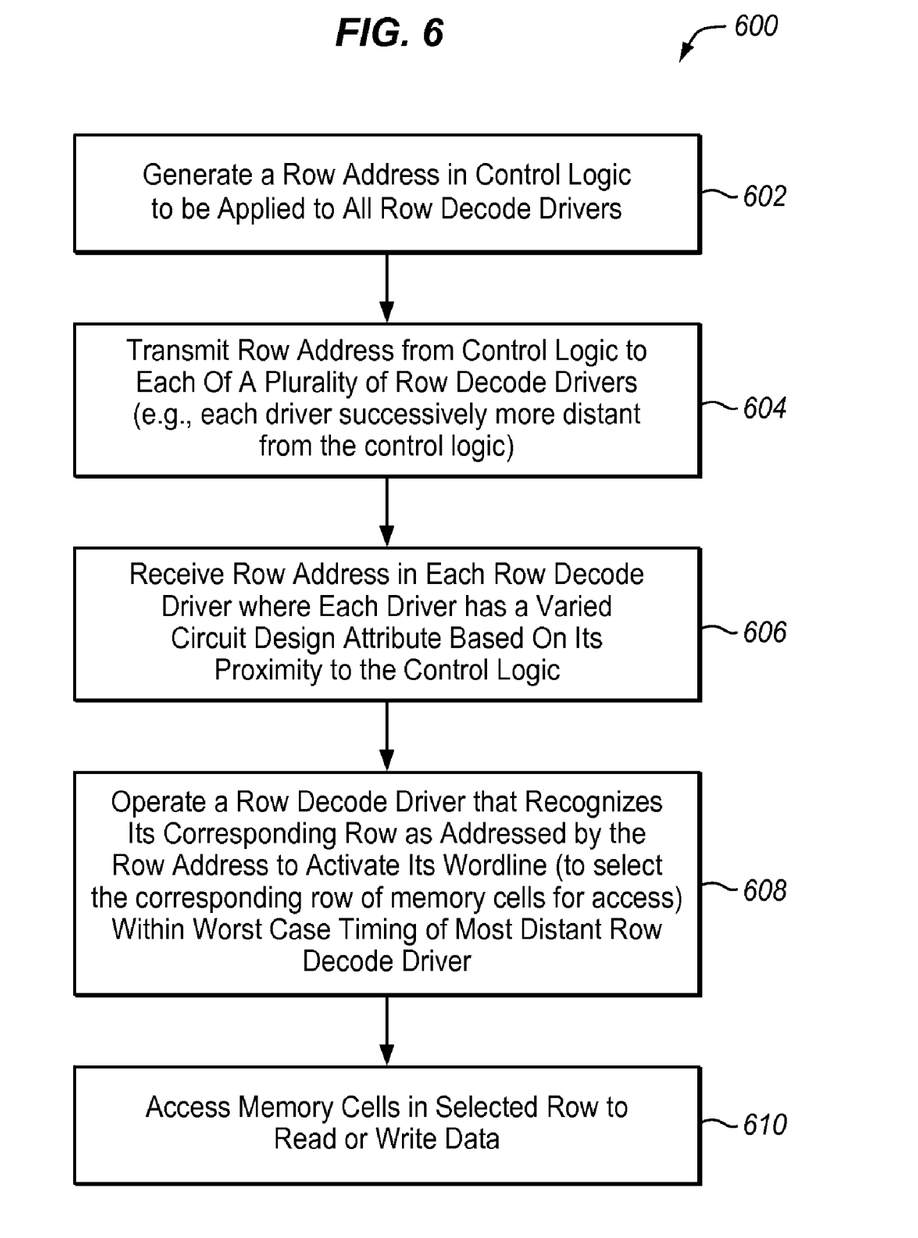
FIG. 6 is a flowchart describing a method of using a memory device of FIG. 1 in an exemplary embodiment of the invention.

FIG. 6 is a method of operating enhanced memory device 100 in an exemplary embodiment of the invention. Method 600 may include other steps not shown. Step 602 of method 600 first generates a row address identifying a particular row of the memory array to be accessed. Control logic coupled to the plurality of row decode drivers through a row address signal path typically generates the row address by extracting or otherwise partially decoding (i.e., "pre-decode") a supplied address value received from some external source (e.g., a processor or other controller coupled to the memory). The generated row address is then transmitted (e.g., applied) to all of the plurality of row decode drivers via the commonly coupled row address signal path by operation of step 604. Since each driver is coupled sequentially along the row address signal path, each is successively more distant from the control logic that generates the row address signal. Step 606 represents receipt of the transmitted row address by each of the plurality of row decode drivers. As discussed above, each row driver circuit has a corresponding distance on the row address signal path from the common control logic element that generates and applies the row address. Thus, each row decode driver has a corresponding variation in one or more circuit design attributes to adjust its performance to reduce leakage power while staying within the timing constraints of any worst case scenario. At step 608, one of the drivers will recognize (e.g., decode) the applied row address as identifying its corresponding row and activate its corresponding wordline to select the corresponding row of memory cells for access. With the row so selected, any of the memory cells in the selected row may be accessed (for reading or writing data) as indicated at step 610. As discussed above and as well known in the art, bitline signal paths are coupled to an input/output line of each memory cell in a corresponding column. Appropriate column related logic is coupled to the bitlines of the columns of memory cells. This column logic is discussed generally above and is well known to those of ordinary skill in the art. The column logic, in general, senses the current stored value of a selected memory cell in a column from the bitline voltage and/or stores a new value in a selected memory cell by applying a particular voltage level to a selected memory cell through the bitline coupling.

While the invention has been illustrated and described in the drawings and foregoing description, such illustration and description is to be considered as exemplary and not restrictive in character. One embodiment of the invention and minor variants thereof have been shown and described. Protection is desired for all changes and modifications that come within the spirit of the invention. Those skilled in the art will appreciate variations of the above-described embodiments that fall within the scope of the invention. As a result, the invention is not limited to the specific examples and illustrations discussed above, but only by the following claims and their equivalents.

What is claimed is:

1. A memory device, comprising:

a plurality of memory cells arranged in a matrix of rows and columns, each memory cell adapted to store information, each memory cell includes an input signal path for selecting the memory cell, and each memory cell includes an input/output signal path for reading information from, or writing information to, the memory cell when selected;

a plurality of wordline signal paths each coupled to the input signal path of the memory cells in a corresponding row of the matrix;

a plurality of row decode drivers each associated with a corresponding row of the matrix, wherein each row decode driver includes an input coupled to a row address signal path, wherein each row decode driver includes an output coupled to the wordline signal path coupled to the corresponding row, wherein each row decode driver is adapted to activate its corresponding wordline signal path by applying a signal to its output in response to receipt of a row address applied to its input that identifies the corresponding row; and control logic adapted to apply a row address along the row address signal path to the plurality of row decode drivers to identify a row of the matrix to be selected by the wordline signal path activated by the row decode driver corresponding to the identified row, wherein each row decode driver includes a circuit design attribute that varies as a function of physical proximity of the row decode driver to the control logic, and wherein the variation of the circuit design attribute of a row decode driver is operable to reduce a leakage power of the row decode driver.

2. The memory device of claim 1 further comprising:
a plurality of bitline signal paths each coupled to the input/output signal path of the memory cells in a corresponding column of the matrix; and
a column circuit coupled to the bitline signal path of a corresponding column to read information from, or write information to, the memory cell in the corresponding column that is selected by the activated wordline signal path.

3. The memory device of claim 1
wherein a worst case signal timing requirement is defined by the length of a signal path associated with the row decode driver physically most distant from the control logic, and
wherein the variation of the circuit design attribute reduces leakage power while maintaining signal timings at least as fast as the worst case signal timing.

4. The memory device of claim 1
wherein the circuit design attribute of the row decode driver is varied by altering a design parameter of a circuit of the row decode driver.

5. The memory device of claim 4
wherein the parameter includes at least one of: a transistor turn-on voltage, a transistor channel width, and a transistor channel length.

6. The memory device of claim 4
wherein the parameter includes drive current of the row decode driver.

7. The memory device of claim 4
wherein the row decode drivers are logically associated in multiple groups and the circuit design attributes of the row decode drivers of a group are similarly varied.

8. The memory device of claim 7
wherein each group comprises row decoders within a predefined percentile range of one another as regards required timing for generating a signal on their respective wordline signal paths.

9. The memory device of claim 7
wherein each group comprises row decoders within a predefined percentile range faster than a worst case required timing for generating a signal on the wordline signal paths coupled to any of the plurality of row decode drivers.

10. A method of operating a memory device comprising a plurality of memory cells arranged in a matrix of rows and columns, the method comprising:
generating a row address in a control logic circuit of the memory device;
transmitting the row address along a row address signal path to a plurality of row decode drivers,
receiving the row address in each row decode driver, wherein each row decode driver is coupled through a corresponding wordline signal path to a plurality the memory cells in a corresponding row, wherein each row decode driver has a circuit design attribute that determines timing of its operation as a function of its physical proximity to the control logic, and wherein variation of the circuit design attribute of a row decode driver is operable to reduce a leakage power of the row decode driver;
operating a row decode driver to select the memory cells in its corresponding row responsive to receipt of a row address identifying its corresponding row, wherein operation of the row decode driver generates a signal on its corresponding wordline signal path in accordance with the timing determined by its circuit design attribute; and
reading data from, or writing data to, the selected memory cells.

11. The method of claim 10
wherein the memory device includes:
a plurality of bitline signal paths each coupled to an input/output signal path of the memory cells in a corresponding column of the matrix; and
a column circuit coupled to the bitline signal path of a corresponding column,
wherein the step of reading or writing comprises:
reading information from the memory cell in the corresponding column and in the selected row, or writing information to the memory cell in the corresponding column and in the selected row.

12. The method of claim 10
wherein a worst case signal timing requirement is defined by the length of a signal path associated with the row decode driver physically most distant from the control logic, and
wherein the variation of the circuit design attribute reduces leakage power while maintaining signal timings at least as fast as the worst case signal timing.

13. The method of claim 10
wherein the circuit design attribute of the row decode driver is varied by altering a design parameter of a circuit of the row decode driver.

14. The method of claim 13
wherein the parameter includes at least one of: a transistor turn-on voltage, a transistor channel width, and a transistor channel length.

15. The method of claim 13
wherein the parameter includes drive current of the row decode driver.

16. The method of claim 13
wherein the row decode drivers are logically associated in multiple groups and the circuit design attributes of the row decode drivers of a group are similarly varied.

17. The memory device of claim 16
wherein each group comprises row decoders within a predefined percentile range of one another as regards required timing for generating a signal on their respective wordline signal paths.

18. The memory device of claim 16
wherein each group comprises row decoders within a predefined percentile range faster than a worst case required timing for generating a signal on the wordline signal paths coupled to any of the plurality of row decode drivers.

* * * * *